United States Patent
Su et al.

(10) Patent No.: US 6,383,915 B1
(45) Date of Patent: May 7, 2002

(54) TAILORING OF A WETTING/BARRIER LAYER TO REDUCE ELECTROMIGRATION IN AN ALUMINUM INTERCONNECT

(75) Inventors: Jingang Su, Sunnyvale; Gongda Yao, Fremont; Zhang Xu, Foster City; Fusen Chen, Cupertino, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/244,280

(22) Filed: Feb. 3, 1999

(51) Int. Cl.$^7$ ........................................ H01L 21/4763
(52) U.S. Cl. ........................ 438/628; 438/654; 438/656
(58) Field of Search ................................ 438/627, 628, 438/648, 653, 654, 656, 685

(56) References Cited

U.S. PATENT DOCUMENTS

| | | | |
|---|---|---|---|
| 5,186,718 A | | 2/1993 | Tepman et al. ............. 29/25.01 |
| 5,236,868 A | | 8/1993 | Nulman ...................... 437/190 |
| 5,320,728 A | | 6/1994 | Tepman ................. 204/192.12 |
| 5,395,795 A | * | 3/1995 | Hong et al. .................. 437/190 |
| 5,543,357 A | * | 8/1996 | Yamada et al. ............. 437/192 |
| 5,703,403 A | * | 12/1997 | Sobue et al. ................ 257/751 |
| 5,709,958 A | | 1/1998 | Toyoda et al. ............... 428/620 |
| 5,763,010 A | * | 6/1998 | Guo et al. ................ 427/376.2 |
| 5,925,225 A | * | 7/1999 | Ngan et al. ............. 204/192.17 |
| 6,001,461 A | * | 12/1999 | Toyoda et al. ............... 428/210 |
| 6,045,666 A | * | 4/2000 | Satitpunwaycha et al. ...................... 204/192.17 |
| 6,066,892 A | * | 5/2000 | Ding et al. .................. 257/751 |
| 6,077,782 A | * | 6/2000 | Hsu et al. .................... 438/688 |
| 6,080,665 A | * | 6/2000 | Chen et al. .................. 438/653 |
| 6,207,568 B1 | * | 3/2001 | Liu et al. ..................... 438/688 |

FOREIGN PATENT DOCUMENTS

| | | | |
|---|---|---|---|
| EP | 0867940 | 9/1998 | ......... H01L/23/532 |
| GB | 2306775 | 5/1997 | ......... H01L/23/532 |

OTHER PUBLICATIONS

S. Rossnagel et al., "Metal ion deposition from ionized mangetron sputtering discharge" J. Vac. Sci. Technol. B. vol. 12, No. 1, Jan./Feb. 1994, pp. 449–453.*

S. Rossnagel et al., "Metal ion deposition from ionized mangetron sputtering discharge" *J. Vac. Sci. Technol.* B. vol. 12, No. 1, Jan./Feb. 1994, pp. 449–453.

S. Rossnagel et al., "Thin, high atomic weight refractory film deposition for diffusion barrier, adhesion layer, and seed layer applications", *J. Vac. Sci. Technol.* B 14(3), May/Jun. 1996, pp. 1819–1827.

S. Vaidya et al., "Effect of Texture and Grain Structure on Electromigration in Al–0.5% Cu Thin Films", Thin Solid Films, vol. 75, No. 3, pp. 253–259 (1981).

(List continued on next page.)

*Primary Examiner*—Caridad Everhart
*Assistant Examiner*—Renzo Rocchegiani
(74) *Attorney, Agent, or Firm*—Shirley L. Church; Kathi Bean

(57) ABSTRACT

We have discovered particular wetting layer or wetting/barrier layer structures which enable depositing of overlying aluminum interconnect layers having <111> texturing sufficient to provide a Rocking Curve FWHM angle θ of about 1° or less. The aluminum interconnect layer exhibiting a Rocking Curve FWHM angle θ of about 1° or less exhibits excellent electromigration properties. In addition when the aluminum layer is subsequently pattern etched, the sidewalls of the etched aluminum pattern exhibit a surprising reduction in pitting compared with pattern etched aluminum layers exhibiting higher Rocking Curve FWHM angles.

48 Claims, 11 Drawing Sheets

OTHER PUBLICATIONS

U.S. application No. 08/825,216, Ngan et al., filed Mar. 27, J. Su et al. "Ionized metal Plasma (IMP) Deposited Underlayers for Hypertextured Aluminum Interconnects for Sub 0.25µm Metallization Schemes" VMIC Conference, Jun. 16–18, 1998 IMIC—108/98/0124(c), pp. 124–126.1997, "Smooth Titanium Nitride Films Having Low Resistivity", of Ngan et al., filed Mar. 27, 1997.

U.S. application No. 08/824,911, Ngan et al., filed Mar. 27, 1997, "A Ti/TiN$_x$ Underlayer Which Enables A Highly [111] Oriented Aluminum Interconnect".

Copy of International Search Report in corresponding European Patent Application No. 0030855.4–2203, mailed May 28, 2001.

* cited by examiner

TAILORING OF A WETTING/BARRIER LAYER TO REDUCE ELECTROMIGRATION IN AN ALUMINUM INTERCONNECT

BACKGROUND OF THE INVENTION

1. Field of the Invention

The present invention pertains to the tailoring of a barrier/wetting layer to increase the <111> crystal orientation of an aluminum interconnect deposited over the barrier layer, thereby reducing electromigration within the aluminum interconnect.

2. Brief Description of the Background Art

Plasma sputtered aluminum is widely used to form interconnects in semiconductor devices. Reliability of the interconnect is critical to the reliability of the device. One of the factors which seriously impacts reliability of an aluminum interconnect is electromigration, where aluminum atoms are physically transferred by electron current. The transferred atoms leave behind void spaces which gradually increase in size with time, eventually causing failure of the interconnect.

In order to reduce electromigration, several different approaches have been used in the industry. For example, doping the aluminum with copper can significantly enhance aluminum grain boundaries, reducing electromigration. Passivation of aluminum surfaces (where a layer of material which does not tend to electromigrate is deposited over the aluminum surface) is also helpful. In damascene or dual damascene structures, several manufacturers have use an underlayer (frequently referred to as a barrier layer) to reduce electromigration of aluminum deposited upon the underlayer. Typically the underlayer is a Ti/TiN dual layer, where Ti is titanium and TiN is titanium nitride.

There are relationships between the aluminum crystalline structure and electromigration available in the literature. One well known and publically accepted relationship is a formulation published by Vaidya and Sinha in 1981:

$$MTTF \, [S/\sigma^2] Log[I(111)/I(200)]^3$$

where MTTF is the mean time to failure, S is the average grain size, $\sigma$ is the standard deviation grain size distribution, I (111) is the aluminum (111) plane diffraction intensity, and I (200) is the aluminum (200) plane diffraction intensity. (See S. Vaidya, A. K. Sinha, *Thin Solid Films*, Vol. 75, p. 253 (1981).

From this relationship, it is readily apparent that the higher the texture of (the amount of) aluminum crystalline orientation, the longer the mean time to failure. Based on this principal, other methods have been developed in the industry for determining the texture of aluminum (111) in a deposited aluminum layer.

One method used in the industry to determine texture is X-ray diffraction, where crystalline structure of a given material is measured by the way in which the material diffracts X-rays of a known wavelength. A description of X-ray diffraction as it was used in development of the present invention is discussed in detail subsequently herein.

Titanium wetting layers and titanium nitride barrier layers deposited using "traditional sputtering methods" have been used in semiconductor device structures underlying aluminum and aluminum alloy layers. However, the crystal orientation of aluminum deposited over the surface of a titanium nitride barrier layer, for example, is typically not highly textured (has a more random crystal orientation) and has poor electromigration resistance. The reliability of interconnecting structures is affected by the electromigration of aluminum having low texturing.

The term "traditional sputtering" or "standard sputtering" refers to a method of forming a film layer on a substrate wherein a target is sputtered and the material sputtered from the target passes between the target and the substrate to form a film layer on the substrate, and no means is provided to ionize a substantial portion of the target material sputtered from the target before it reaches the substrate. One apparatus configured to provide traditional sputtering is disclosed in U.S. Pat. No. 5,320,728, the disclosure of which is incorporated herein by reference. In such a traditional sputtering configuration, the percentage of target material which is ionized is believed to be less than 10%, and more typically less than 1%, of that sputtered from the target.

A "traditionally sputtered" titanium nitride-comprising film or layer is deposited on a substrate by reactive sputtering where a titanium target is sputtered with a plasma created from an inert gas such as argon in combination with nitrogen gas. A portion of the titanium sputtered from the target reacts with nitrogen gas which has been activated by the plasma to produce titanium nitride, and the gas phase mixture contacts the substrate to form a titanium nitride-comprising layer on the substrate. When the proper amount of nitrogen is present in the plasma source gas, the titanium and nitrogen concentrations in the titanium nitride-comprising layer is stoichiometric. Although such a traditionally sputtered titanium nitride-comprising layer can act as a wetting layer for hot aluminum fill of contact vias, good fill of the via generally is not achieved at substrate surface temperature of less than about 500° C. Traditional sputtering produces overhang along the edges of the opening to a trench or via to be filled, and a higher temperature is required to flow the aluminum sufficiently to overcome the overhang.

U.S. Pat. No. 5,543,357 to Yamada et al., issued Aug. 6, 1996, describes a process for manufacturing a semiconductor device wherein a titanium film is used as an under film for an aluminum alloy film to prevent the device characteristics of the aluminum alloy film from deteriorating. The titanium film is formed by a sputtering process over a substrate surface containing a via hole. Subsequently an aluminum film is sputtered over the titanium film. Next, the substrate is heated to 450° C. to 500° C. to melt the aluminum alloy film, thereby filling the via hole therewith. The thickness of the titanium film is set to 10% or less of the thickness of the aluminum alloy film and at most 25 nm. In the case of the aluminum alloy film containing no silicon, the titanium film is set to 5% of less of the thickness of the aluminum alloy film. In another aspect of the process, a titanium nitride film is formed over the substrate surface prior to application of the titanium film.

S. M. Rossnagel and J. Hopwood describe a technique of combining conventional magnetron sputtering with a high density, inductively coupled RF plasma in the region between the sputtering cathode and the substrate in their 1993 article titled "Metal ion deposition from ionized magnetron sputtering discharge", published in the J. Vac. Sci. Technol. B. Vol. 12, No. 1, January/February 1994. This article describes relative ionization level for sputtered aluminum as a function of various process variables. Further, there is a less detailed, general description of the deposition of TiN films as thin liners or diffusion barriers along the sides and bottom of high aspect ratio trenches. TiN films deposited at lower ion energies (0–10 eV) are said to be bronze in color with resistivities in the 200 $\mu\Omega$cm range, while films deposited at higher ion energies (20–50 eV) are said to be bright yellow gold in color with resistivities in the 75 μΩcm range, but are said to be characteristic of highly stressed films. Peeling is said to be common at thicknesses over 700 Å, with depositions on circuit topography features delaminating upon cleaving. Further description of a high density plasma sputtering method is provided by S. M. Rossnagel and J. Hopwood in their paper "Thin, high atomic weight refractory film deposition for diffusion barrier, adhesion layer, and seed layer applications", *J. Vac. Sci. Technol. B*, Vol. 14, No. 3 (May/June 1996).

U.S. patent application, Ser. No. 08/824,991 of Ngan et al., filed on Mar. 27, 1997, describes a Ti/TiN/TiN$_x$ underlayer which enables a highly (111) oriented aluminum interconnect. In particular, all three layers are deposited using ion metal plasma techniques, where a high density plasma is created between the sputtering cathode and the substrate support electrode, whereby an increased portion of the sputtered emission is in the form of ions at the time it reaches the substrate surface. The Ti first layer ranges in thickness from greater than about 100 Å to about 500 Å; the TiN second layer ranges in thickness from about 100 Å to about 800 Å; and the TiN$_x$ third layer, having a thickness ranging from about 15 Å to about 500 Å, is formed at the end of the deposition of the TiN layer by turning off the nitrogen gas feed to the process chamber. This technology pertains to a multi-layered barrier/wetting system where each layer is applied from a high density plasma, with the aluminum fill deposited over a temperature range from about 350° C. to about 500°. This application is assigned to the assignee of the present invention and is hereby incorporated by reference.

The present invention is an improvement over the art cited above in that it provides titanium-comprising wetting layers and wetting/barrier structures which enable the deposition of high (111) content aluminum interconnects, while reducing the complexity of the fabrication process and the cost of the equipment necessary for fabrication.

SUMMARY OF THE INVENTION

We have discovered that it is not necessary to have a tri-layer wetting layer/barrier layer structure (Ti/TiN/TiN$_x$) of the kind described in several of the references cited above to obtain a subsequently deposited aluminum interconnect layer having excellent electromigration properties. We have discovered a number of different wetting layer or wetting/barrier layer structures which enable depositing of overlying aluminum interconnect layers having <111> texturing sufficient to provide a Rocking Curve FWHM angle θ of about 1° or less. These barrier layers include: 1) Ti alone, where the Ti is deposited using a high density plasma; 2) Ti/TiN, where both layers are deposited using a high density plasma; and, 3) Ti/TiN, where the Ti layer is deposited using a high density plasma and the TiN layer is deposited using standard sputtering techniques or collimated sputtering techniques. These barrier layers can be formed on a substrate in a single process chamber or in two process chambers, depending on the composition of the barrier layer and the features available in a given deposition chamber.

In addition, we have discovered that when it is desired to use a tri-layer barrier layer (for reasons other than electromigration resistance), a Ti/TiN/TiN$_x$ tri-layer having at least the initial Ti layer formed in a high density plasma provides excellent electromigration resistance in an aluminum layer subsequently deposited thereover. This is true even when the aluminum deposition temperature is below about 350° C., for interconnect applications.

We further determined that the application of bias to a substrate (to attract ions toward the substrate) during deposition of at least the initial Ti layer is beneficial in improving the <111> texturing of a subsequently-deposited aluminum layer up to a point, after which the <111> texturing decreases. This effect is generally observed up to be independent of aluminum deposition temperature for deposition temperatures up to about 350° C.

DETAILED DESCRIPTION OF THE PREFERRED EMBODIMENTS

Figure 1A:
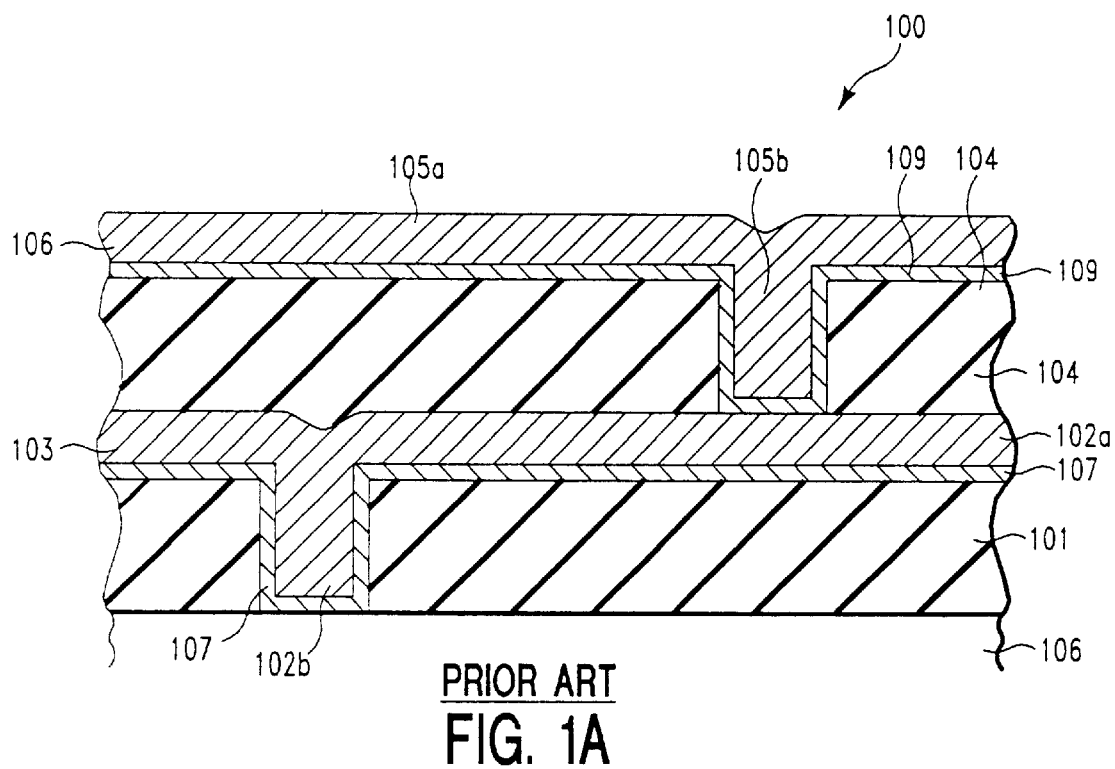
FIG. 1A is a schematic of a cross-sectional view of a multi-layer metal stack including aluminum-filled contact vias in combination with aluminum interconnect lines.

The present invention pertains to the tailoring of a wetting layer or a wetting layer/barrier layer structure to increase the <111> crystal orientation of an aluminum interconnect deposited over the barrier layer, thereby reducing electromigration within the aluminum interconnect. Of particular interest, we have determined that the following wetting layer and wetting/barrier structures permit the deposition of aluminum interconnect layers having <111> texturing sufficient to generate a Rocking Curve FWHM angle of about 1° or less. This Rocking Curve angle indicates a significant improvement in the electromigration properties of the aluminum over those previously known in the art. The wetting layer and wetting/barrier structures: 1) Ti alone, where the Ti is deposited using a high density plasma; 2) Ti/TiN, where both layers are deposited using a high density plasma; and 3) Ti/TiN, where the Ti layer is deposited using a high density plasma and the TiN layer is deposited using standard sputtering techniques. These barrier layers can be formed on a substrate in a single process chamber or in more than one process chamber if desired.

I. Definitions

As a preface to the detailed description, it should be noted that, as used in this specification and the appended claims, the singular forms "a", "an", and "the" include plural referents, unless the context clearly dictates otherwise. Thus, for example, the term "a semiconductor" includes a variety of different materials which are known to have the behavioral characteristics of a semiconductor, and a reference to "an aluminum interconnect material" includes aluminum and aluminum alloys.

Specific terminology of particular importance to the description of the present invention is defined below.

The term "aluminum" includes alloys of aluminum of the kind typically used in the semiconductor industry. Such alloys include aluminum-copper alloys, and aluminum-copper-silicon alloys, for example. A typical aluminum-copper alloy might include about 0.5% copper, by way of example and not limitation.

The term "aspect ratio" refers to the ratio of the height dimension to the width dimension of particular openings. Typically the width dimension used to calculate the aspect ratio is the minimum feature dimension. For example, a via opening which typically extends in a tubular form through multiple layers has a height and a diameter, and the aspect ratio would be the height of the tubular divided by the diameter. The aspect ratio of a trench would be the height of the trench divided by the minimal travel width of the trench at its base.

The term "feature" refers to contacts, vias, trenches, and other structures which make up the topography of the substrate surface.

The terms "high density plasma technique", or "ion-deposition sputtered", or "ion metal plasma sputtered" refer to physical vapor deposition (preferably magnetron sputter deposition), where a high density plasma is created between the sputtering cathode and the substrate support electrode, whereby the portion of the sputtered emission in the form of ions at the time it reaches the substrate surface is increased.

The term "high density plasma" refers to, but is not limited to, a plasma having an electron density of at least $5 \times 10^{10}$ e$^-$/cm$^3$.

The term "reactive ion deposition", "reactive ion metal plasma", or "reactive high density plasma technique" refers to, but is not limited to physical vapor deposition from a high density plasma where a reactive gas is supplied during the sputtering to react with the ionized material being sputtered, producing an ion-deposition sputtered compound containing the reactive gas element.

The term "reactive sputtering" refers to standard or traditional sputtering wherein a reactive gas is supplied during the sputtering to react with the material being sputtered, producing a sputter deposition compound containing the reactive gas element.

The term "SEM" refers to a scanning electron microscope.

The term "XRD" (X-ray Diffraction) refers to a technique commonly used to measure crystalline orientation, wherein radiation over particular wavelengths is passed through the material to be characterized, and the diffraction of the radiation, caused by the material through which it passes, is measured, typically in a process to determine the crystal orientation within a sample exposed to the radiation.

II. An Apparatus for Practicing the Invention

Figure 6:
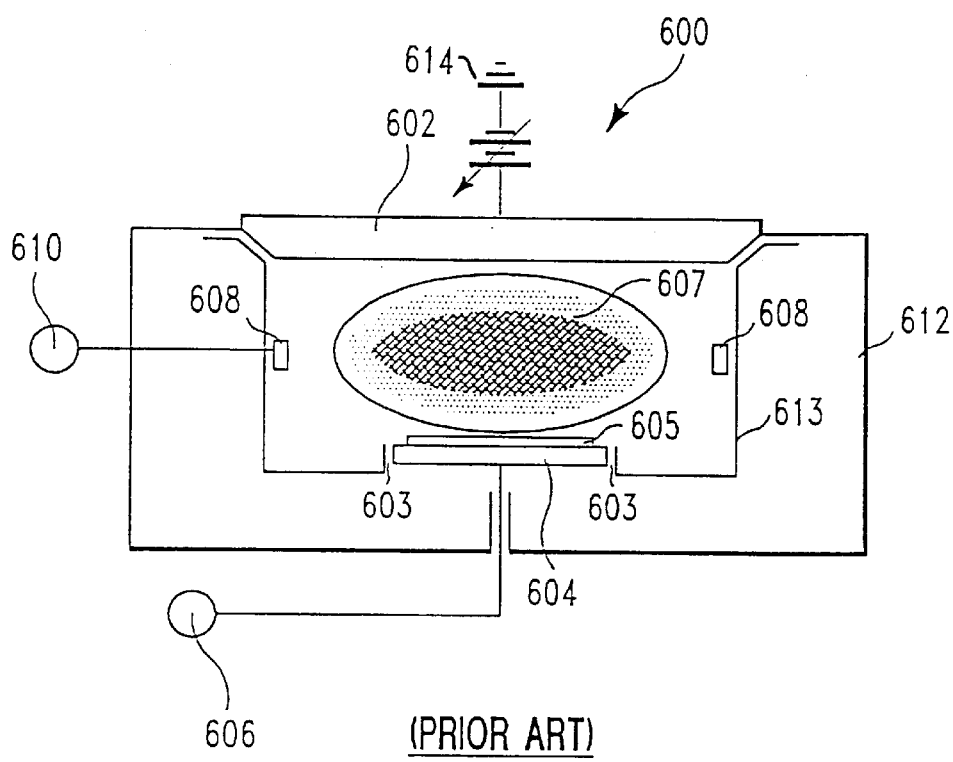
FIG. 6 shows a schematic of an apparatus having the critical elements necessary for depositing a sputtered wetting, barrier, or metallization layer using high density plasma techniques.

A process system in which the method of the present invention may be carried out is the Applied Materials, Inc. (Santa Clara, Calif.) Endura® Integrated Processing System. This process system is not specifically shown in the Figures, however, the processing elements shown in FIG. 6 can be operated within one of the low pressure process chambers contained within such an Integrated Processing System. The system is shown and described in U.S. Pat. Nos. 5,186,718 and 5,236,868, the disclosures of which are incorporated by reference. With reference to FIG. 6, which shows the critical elements of a high density plasma sputter deposition system, process chamber 600 can be used for the high density plasma deposition of a barrier layer such as a Ti or a $Ti_xN_y$ layer. This process chamber can also be used for standard sputtering when no power is applied to ionization coil 608.

Process chamber 600 is typically a magnetron chamber which employs a standard sputter magnet (not shown) to confine the sputtering plasma, enabling an increased sputtering rate. In addition, the process chamber includes an inductively coupled RF source 610, typically in the form of a single, flat coil 608, positioned between a sputtering cathode (target) 602 and the substrate support electrode 604, whereby a larger portion of the sputtered emission is in the form of ions at the time it reaches the substrate surface. A DC power source 614 provides power to the target 602. An RF power source 606 may be used to apply a bias to substrate support electrode 604, enabling formation of a DC bias on semiconductor substrate 605. Typically a shield surrounds the area in which plasma 607 is created from gases which enter through channels 603. Shield 613 is surrounded by a vacuum chamber 612 which enables the evacuation of gases from the substrate processing area through evacuation channels (not shown). In the preferred embodiment of the present invention where the barrier layer to be formed is $Ti_xN_y$, the titanium nitride is formed by sputtering a titanium target using techniques known in the art, where argon gas is used to create sputtering ions, and by adding nitrogen to the process chamber 600 through channels 603. At least aportion of the nitrogen is ionized as it passes by ionization coil 608. The reactive nitrogen is free to react with reactive titanium to form titanium nitride which may be attracted toward the surface of semiconductor substrate 605 by the bias placed on that substrate. U.S. Pat. No. 5,925,225, to Ngan et al., describes smooth titanium nitride films having low resistivity and their method of making. The '225 patent includes a description of the effect of numerous process variables upon the TiN characteristics, including film crystal orientation. The '225 patent is assigned to the assignee of the present invention and is hereby incorporated by reference.

Figure 7:
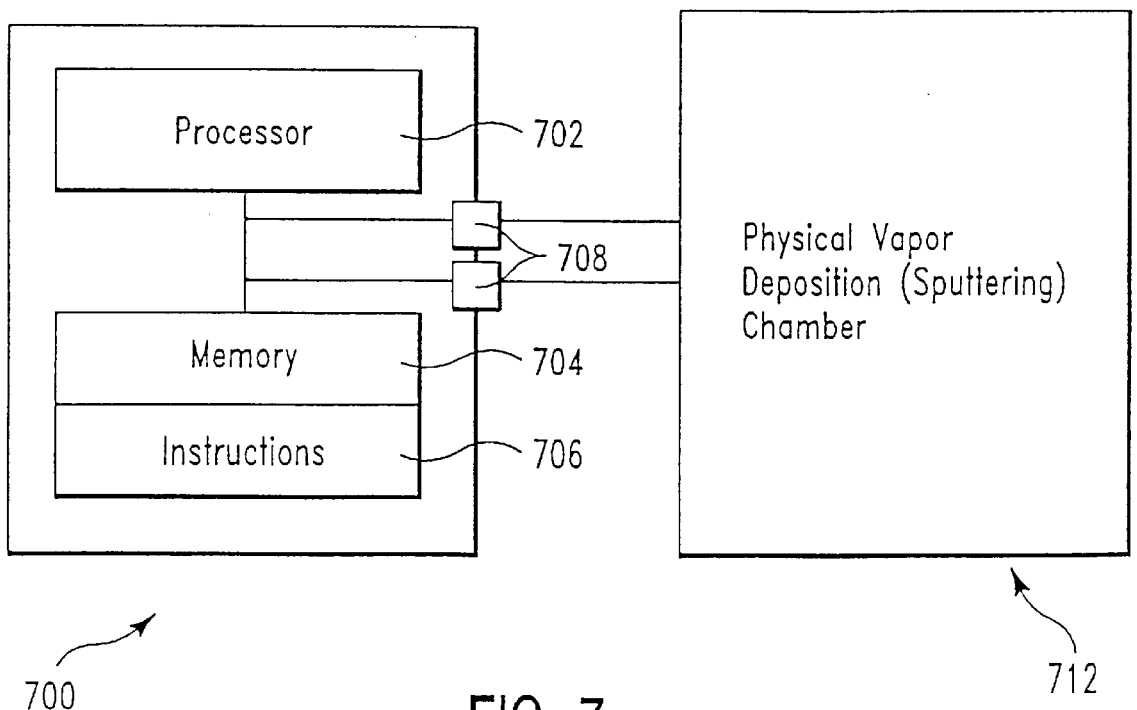
FIG. 7 shows a schematic of a physical vapor deposition chamber (sputtering chamber) controlled by a computer programmed to facilitate carrying out of the method of the present invention in the sputtering chamber.

FIG. 7 shows a physical vapor deposition chamber of the kind described with reference to FIG. 6, where the physical vapor deposition chamber (typically a sputtering chamber) is controlled by a computer programmed to facilitate carrying out of the method of the present invention in the chamber. The computer 700 comprises a processor 702, memory 704 adapted to store instructions 706, and one or more ports 708. Processor 702 is adapted to communicate with memory 704 and to execute instructions 706. Processor 702 and memory 704 are also adapted to communicate with one or more ports 708. Ports 708 are adapted to communicate with physical vapor deposition chamber 712. Physical vapor deposition chamber 712 is adapted to carry out process steps in accordance with signals received from processor 702 via ports 708. Preferably, computer 700 can control process variables to accomplish the method of the present invention.

X-Ray Diffraction Measurement Technique

In our work, the X-ray wavelength was that of the Cu Kα line. The deposited thin-film sample was initially mounted so that its major surface was on the same plane as the source of the X-ray beam and the same plane as the ionization detector, with the X-ray source on the right hand side of the sample and the ionization detector on the left hand side of the sample. At this initial position, the detector angle and the X-ray source angles are each zero degrees from the plane of the major sample surface. Subsequently, the right hand edge of the sample adjacent the X-ray source was rotated counter-clockwise from its original position, by an amount providing an incident angle θ from the source of the X-ray beam. For measuring aluminum <111>, depending on the quality of the sample, 2θ typically ranges from about 38.5 degrees to about 38.6 degrees. The detector was then rotated in a counter-clockwise direction by an amount providing an angle 2θ from the original plane of the sample surface (so that the angle between the X-ray source and the detector was 180 degrees minus 2θ), to automatically ensure that the detector was in the correct position to detect the diffraction beam. The diffraction angle θ from the lattice plane for aluminum <111> is also called the Bragg angle for aluminum <111>.

The scan from the detector at zero degrees to 80 degrees provided both the intensity and the 2θ diffraction angle from all possible reflections of the sample lattice planes. A commonly reported indication of aluminum orientation quality, also referred to as "texture", is the "Rocking Curve", which is a measurement obtained by rotating (rocking) a sample through the specified Bragg angles of its phases while the detector is fixed at 2θ. A plot of the CPS (photon counts per second) at an increasing angle of measurement is made, generating a distribution curve of the quantity of the specific crystal orientation measured at increasing angles. The FWHM of a Rocking Curve is calculated by measuring the width of the curve at a position on the curve which represents one half of the maximum height of the curve. The FWHM (full width at half maximum), expressed in degrees, represents the number of degrees spanned by the width of the curve at half its maximum height. A wider curve, spanning a larger number of degrees, indicates that the crystallographic orientation of interest is not highly textured. A narrow curve, spanning a limited number of degrees is a strong signal, indicating a larger quantity of the crystallographic orientation of interest (a high texture). The FWHM measurement is preferred as an indicator of crystallographic orientation or "texture" over the diffraction intensity, since it is less sensitive to the measurement variables and is a direct indicator of the degree of texture for a given sample. The Rocking Curve FWHM has become a standard indicator of electromigration resistance for a deposited aluminum film and is referenced herein for this purpose.

Titanium Wetting Layers

Figure 1B:
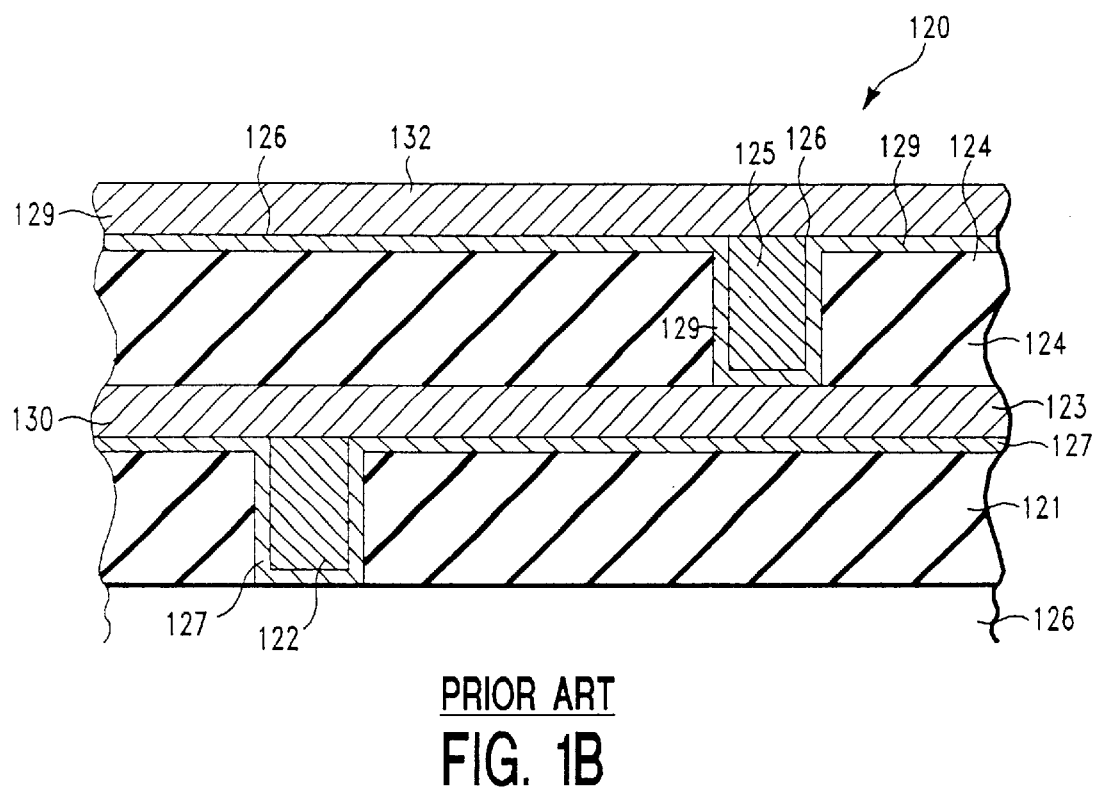
FIG. 1B is a schematic of a cross-sectional view of a tungsten-filled contact via in combination with an aluminum interconnect line.

Titanium can be used alone as a wetting layer which improves the electromigration of aluminum interconnect features, provided the thickness of the titanium layer is such that it does not consume an unreasonable amount of the aluminum layer deposited over the barrier layer surface. FIGS. 1A and 1B are schematics showing example interconnect features. FIG. 1A shows a device structure 100 which includes a substrate 106 having deposited on its surface a layer of dielectric material 101. Layer 101 is patterned to create openings for metallization including electrical contacts 102b. A wetting layer or a wetting/barrier layer structure 107 is applied over the surface of dielectric layer 101, followed by deposition of a metal layer 103 (typically aluminum) to fill electrical contacts 102b and provide an metal film over the surface of dielectric layer 101. Metal layer 103 is then etched using techniques known in the art to produce interconnect aluminum structures such as lines 102a. A layer of dielectric 104 is then applied over the surface of the metal fill layer 103. Dielectric layer 104 is then patterned to create additional openings for metallization, including electrical contacts 105b. A wetting layer or wetting/barrier layer structure 109 is then applied over the surface of dielectric layer 104, followed by deposition of a metal layer 106 to fill electrical contacts 105b and provide a metal film over the surface of dielectric layer 104. Metal layer 106 can then be etched to provide interconnect lines 105a. In this manner, multi-level conductive devices are created.

FIG. 1B shows a similar device structure where the electrical contact is filled with a tungsten plug which is subsequently overlaid with an aluminum interconnect. With reference to FIG. 1B, a device structure 120 which includes a substrate 126 having deposited on its surface a layer of dielectric material 121. Dielectric layer 121 is patterned to create an opening for an electrical contact 122. A wetting layer or wetting/barrier layer structure 127 is applied over the surface of dielectric layer 121, which is subsequently filled with tungsten. The tungsten is planarized using techniques known in the art (such as CMP) to leave a tungsten plug in electrical contact 122 with the surfaces of wetting layer or wetting/barrier layer structure 127 outside of electrical contact 122 planar and essentially free of tungsten if desired. A layer 130 of aluminum is then deposited over the planarized surface. Layer 130 of aluminum is then etched using techniques known in the art to produce interconnect aluminum structures such as lines 123. A layer of dielectric 124 is applied over the surface of the etched aluminum. Dielectric 124 is then patterned to create an opening for electrical contacts 125. A wetting layer or wetting/barrier layer structure 129 is then applied over the surface of dielectric layer 124, and electrical contact 125 is filled with tungsten. The tungsten is planarized using techniques such as CMP to leave a tungsten plug in electrical contact 125. Subsequently, an aluminum layer 132 is deposited over the planarized surface. Aluminum layer 132 is then etched to produce interconnect lines 126. In this manner, multi-level conductive devices are created.

Figure 3:
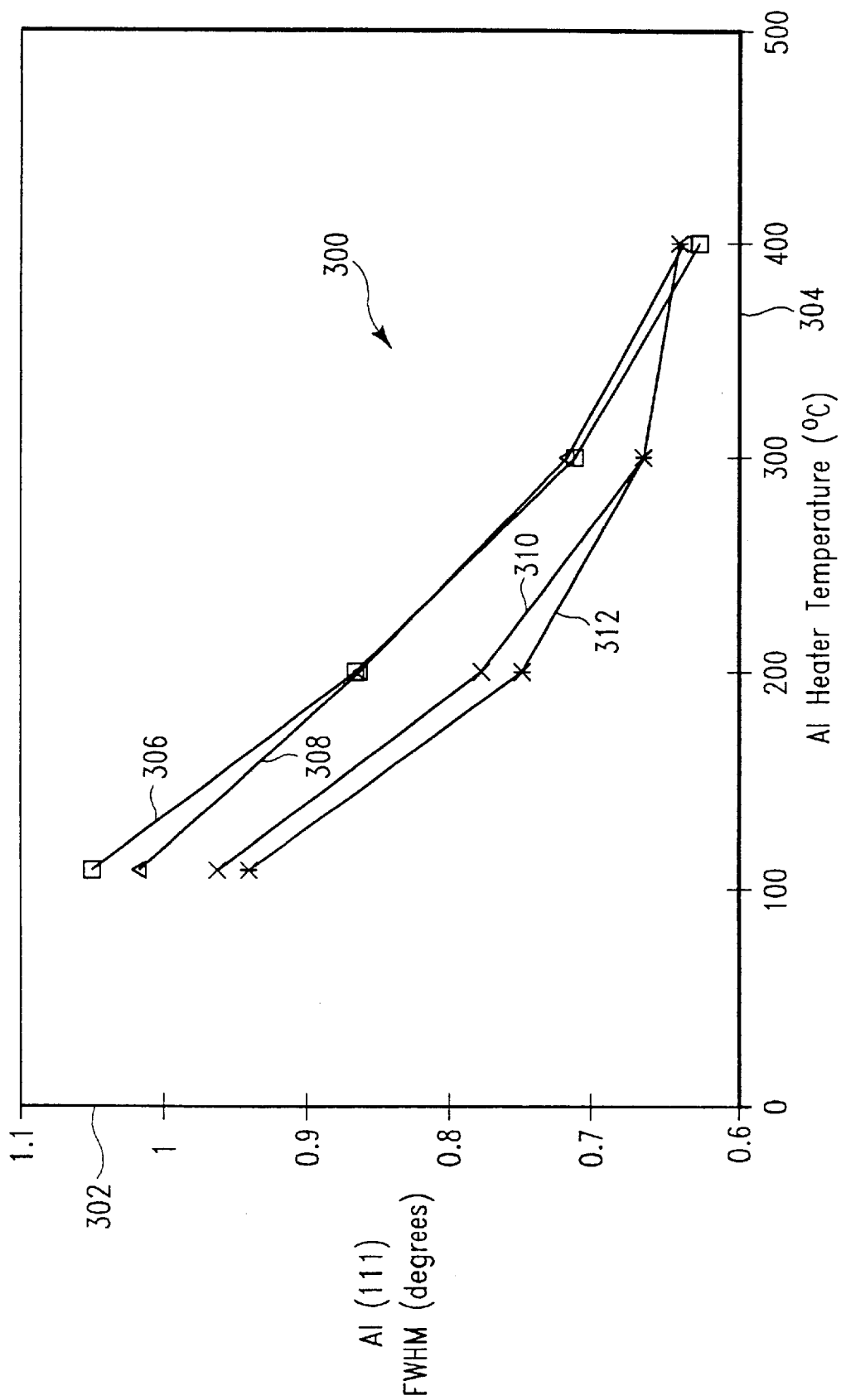
FIG. 3 is a graph showing data for Ti wetting layers deposited using a high density plasma, with an aluminum layer deposited over the Ti wetting layer surface using traditional, standard sputtering techniques. The Ti layers were deposited over a substrate with various amounts of bias applied to the substrate during deposition. The <111> Rocking Curve FWHM of the deposited aluminum layer is shown as a function of the aluminum deposition temperature for each of the different Ti wetting layers.

Use of a wetting layer of Ti under a metallization layer of aluminum can provide a significant improvement in the electromigration resistance of the aluminum, provided the Ti layer is deposited using high density plasma techniques. We have been able to obtain aluminum interconnects exhibiting such improved electromigration resistance, as illustrated by an aluminum layer <111> Rocking Curve FWHM angle of about 1° or less. FIG. 3 shows a graph 300 of the aluminum <111> FWHM angle (shown in degrees on axis 302) as a function of the deposition temperature of the aluminum (the substrate support platen temperature is shown in °C. on axis 304; the actual temperature of the substrate onto which the aluminum is deposited is approximately 50° C. lower.

A series of curves illustrate the effect of bias power on the <111> Rocking Curve FWHM of an aluminum layer deposited using high density plasma technique over a titanium wetting layer, when the titanium wetting layer is deposited using high density plasma technique upon a substrate biased to different voltages. Curve 306 is for a titanium wetting layer deposited in the presence of a high density plasma with an applied bias producing about −10 V on the substrate. Curve 308 represents a titanium wetting layer deposited with about −30 V on the substrate. Curve 310 represents a titanium wetting layer deposited with about −45 V on the substrate. Curve 312 represents a titanium wetting layer deposited with about −55 V on the substrate. At these substrate biasing levels, an improvement in the overlying aluminum layer <111> FMWH is observed in all instances. The <111> Rocking Curve FMWH of the aluminum layer is also shown as a function of the temperature at which the aluminum is deposited. Up to a heater temperature of about 380° C. (substrate temperature of about 330° C.), the use of an increasing substrate bias during deposition of the titanium wetting layer appears to have a beneficial effect. Above that temperature, the effect of application of bias to the substrate during the high density plasma deposition of the titanium wetting layer tends to level out, as shown in FIG. 3.

With reference to FIG. 3, the titanium wetting layers upon which the aluminum was deposited were deposited in an ENDURA® metal deposition chamber. Each barrier layer was deposited on an individual test wafer. The test wafer surface was a layer of silicon oxide about 10,000 Å thick. The thickness of each titanium wetting layer was about 300 Å. With reference to FIG. 6, the deposition chamber was operated under the following conditions: The power to the titanium target 602 was about 2 kW of DC. A high density, inductively coupled RF plasma 607 was generated in the region between the titanium target cathode 602 and the substrate 605 by applying RF power of about 2.5 kW at a frequency of about 2 MHZ to flat coil 608. The deposition chamber pressure typically was selected to be from about 10 to about 35 mT. The substrate temperature during deposition of the titanium wetting layer was approximately 80° C.

An aluminum layer having a thickness of about 5,000 Å was deposited over each barrier layer sample structure. The aluminum was deposited in a standard ENDURA® process chamber using standard sputtering techniques. The power to the aluminum target was approximately 9 kW of DC. No bias was applied to the substrate. The process pressure was 2 mT, and the aluminum was deposited at a substrate temperature which was about 50° C. lower than the substrate support pedestal heater temperature shown on axis 304 of FIG. 3.

In the past it was believed that if the <200> crystalline (grain) orientation content of the titanium barrier layer was higher, this translated to a higher texturing in an aluminum layer applied over the surface of the titanium barrier layer. However, we have discovered that the texturing (Rocking Curve FWHM angle) of the aluminum layer does not directly correlate with the XRD peak intensity, which is indicative of the <200> content of the titanium barrier layer.

As a result of this discovery, we have theorized that a more dense and smoother titanium surface is produced when the titanium barrier layer surface is moderately bombarded with ions during deposition. This more dense and smoother titanium surface enables the deposition of an aluminum layer which can achieve better <111> texturing and which is more electromigration resistant, despite the fact that the (200) content of the titanium is lower as a result of the ion bombardment of the titanium wetting layer surface during its deposition.

In another surprising discovery, we learned that when the <111> texturing of the deposited aluminum layer is higher (the Rocking Curve FWHM angle is lower), not only is the electromigration resistance of the aluminum improved, but if the aluminum is pattern etched, the tendency of the sidewalls of the etched feature to pit during etching is reduced.

Figure 2A:
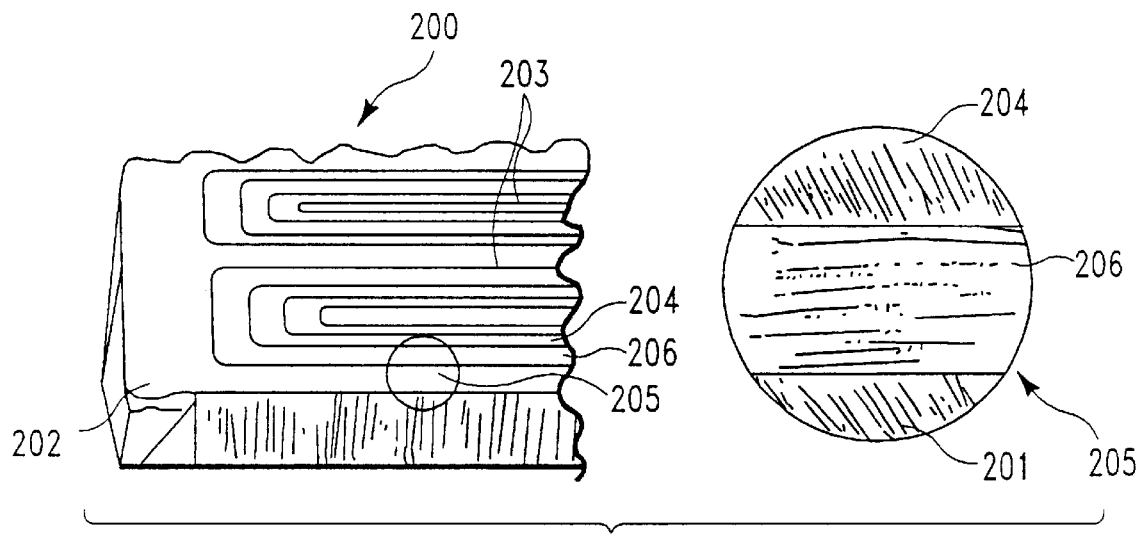
FIGS. 2A and 2B show a schematic three-dimensional view of etched aluminum lines, with an enlargement in each case of a side view of the surface of the etched metal line. The enlarged view of the etched metal surface shows the effect of the amount of <111> aluminum texturing on the amount of sidewall pitting which occurs during etching of the aluminum lines.
Figure 2B:
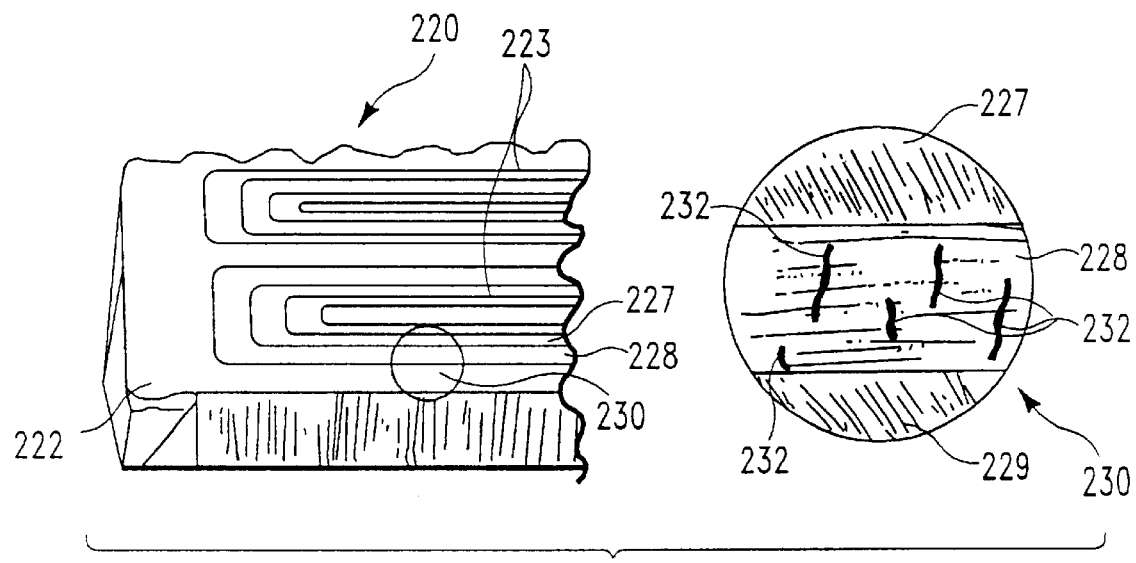

FIG. 2B is illustrative of an etched aluminum feature 220 where a standard wetting/barrier bi-layer structure consisting of Ti/TiN (not shown) was used as an underlying structure under the deposited aluminum layer. Both the Ti layer and the TiN layer were deposited using standard sputtering techniques, and the <111> Rocking Curve FWHM of the deposited aluminum layer was about 2 to 3 degrees. Aluminum layer 222 was etched in a CENTURA® process chamber using aluminum etch conditions which are standard and commonly used in the art. Etched feature 220 included grooves 223, having an upper surface 227 and side walls 228. Side walls 228 exhibited pitting 232 as a result of the etching process. The pitting 232 of side wall 228 is shown in enlargement 230 (where 227 represents the upper surface of aluminum layer 222, 228 represents the sidewall of etched groove 223, and 229 represents the bottom surface of the etched groove.

FIG. 2A is illustrative of an etched feature 200 which was achieved using the method of the present invention. A Ti/TiN wetting/barrier bi-layer structure (not shown) was used as an underlying structure during deposition of aluminum layer 202. The Ti wetting layer was deposited using high density plasma techniques and the TiN layer was deposited using standard sputtering technique. The overlying aluminum layer 202 produced exhibited a <111> FWHM of about 1 to 1.5 degrees. Aluminum layer 202 was etched using same standard aluminum etch conditions described with reference to FIG. 2B, in a CENTURA® process chamber. Etched feature 200 included grooves 203, which exhibited no pitting of sidewall 206, as shown in enlargement 205 (where 204 represents the upper surface of aluminum layer 202, 206 represents the sidewall of etched groove 203, and 201 represents the bottom surface of the etched groove.

It is important to mention that when a titanium wetting layer is used in the absence of the titanium nitride barrier layer, the thickness of the titanium wetting layer needs to be restricted so that the amount of aluminum layer which reacts with the titanium is controlled. This is important to prevent volume changes and to enable CMP of the aluminum surface. We have determined that the <111> FWHM of an aluminum layer deposited over the present invention Ti wetting layer improves as the thickness of the Ti wetting layer is increased from 100 Å up to about 300 Å. Above about 300 Å, we do not see much improvement. A standard aluminum layer thickness is about 5,000 Å to about 6,000 Å, and only about 400 Å of aluminum should be consumed by reaction with the 100 Å titanium wetting layer.

Ti/TiN Wetting/Barrier Layers

We have investigated Ti/TiN wetting/barrier layer structures where the Ti is deposited in the presence of a high density plasma and the Ti/N is deposited in three different manners: 1) in the presence of a high density plasma; 2) using a collimation technique; 3) using traditional sputtering technique.

When the device structure to be fabricated is an interconnect which is relatively flat, as compared to high aspect ratio (greater than 2:1) features, it is not necessary to have a TiN or a $TiN_x$ surface directly under the aluminum layer to induce aluminum flow. In such an instance, a Ti wetting layer is generally adequate. Further, it is not necessary to deposit the aluminum at such high temperatures as those recommended in several of the references cited in the Background Art section of this application. The aluminum can be deposited upon the barrier layer at temperatures ranging from about 25° C. up to 500° C., and preferably below about 350° C.

For aspect ratios greater than 2:1, it is advisable to use a Ti/TiN or $Ti/TiN_x$ (where x is less than 1) bi-layer wetting layer. A Ti/TiN layer is preferred, to reduce the formation of particulates. To provide the best Ti/TiN wetting/barrier layer, it is recommended that both the Ti and the TiN layer be deposited in the presence of a high density plasma. However, the TiN layer may also be sputtered using a collimated technique or a standard sputtering technique. Depending on the amount of bias applied to the substrate at the time of deposition of the TiN layer, there will be a thickness limitation for the TiN layer if the <111> Rocking Curve FWHM angle of the aluminum is to be kept below about 1°.

Figure 4A:
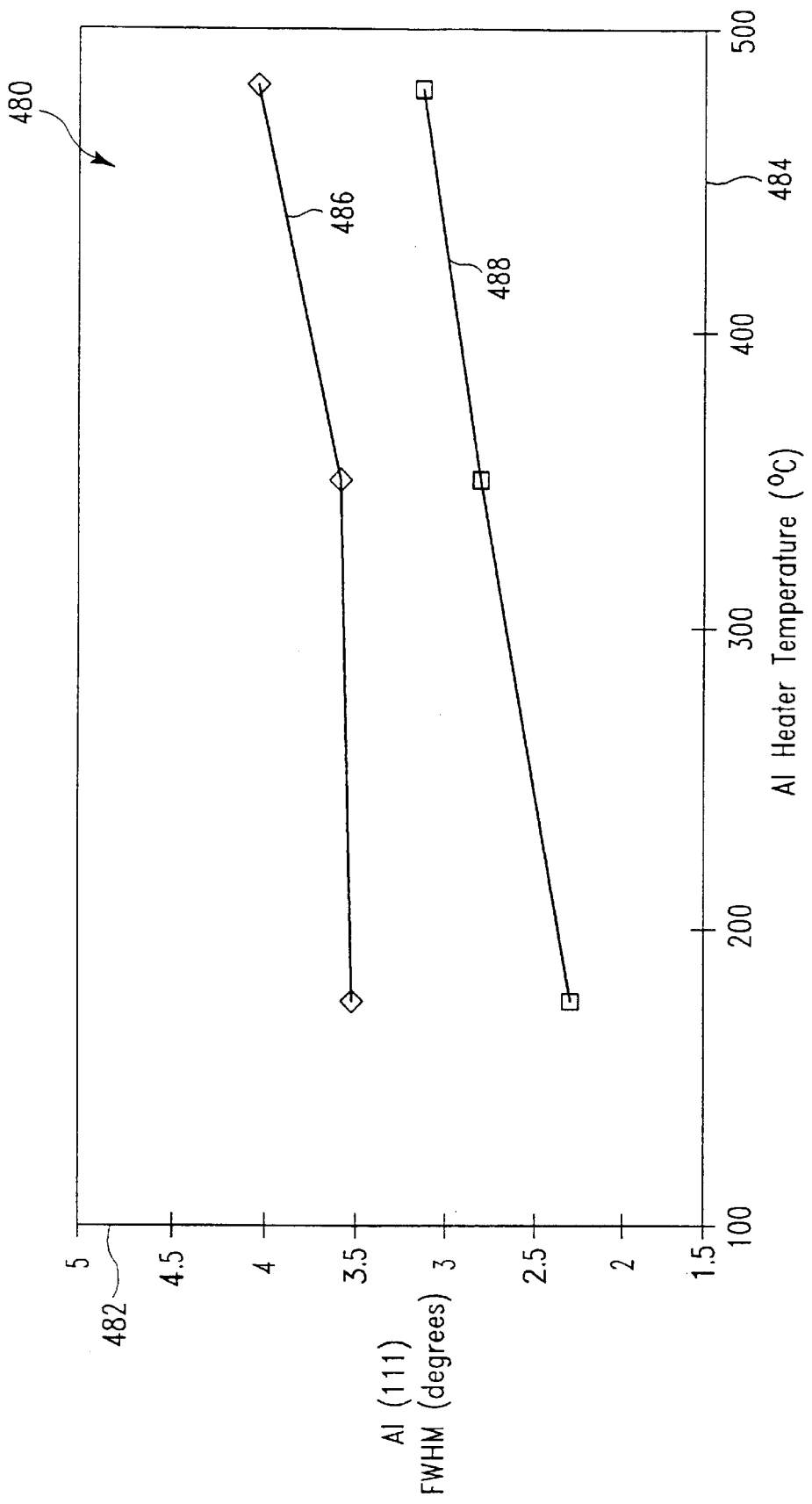
FIG. 4A is a graph showing the <111> Rocking Curve FWHM angle of an aluminum layer deposited over a bi-layer wetting/barrier structure consisting of a Ti wetting layer deposited using standard sputtering techniques and a TiN barrier layer deposited using standard sputtering techniques. Two curves are shown, representing different Ti and TiN thicknesses. The FWHM angle of the aluminum is shown as a function of the aluminum deposition temperature. This is comparative data showing prior art results over which the present invention provides an improvement.

FIG. 4A is a graph 480 showing prior art comparative data for the <111> FWHM (shown on axis 482) of an aluminum layer deposited over a Ti/TiN bi-layer wetting/barrier layer as a function of the aluminum deposition temperature (shown on axis 484). Both the Ti wetting layer and the TiN barrier layer were deposited using standard sputtering techniques and without the application of bias to the substrate. Curve 486 shows data for a 200 Å thick Ti wetting layer and a 600 Å thick TiN barrier layer, overlaid by an aluminum layer 5,000 Å thick (which was also sputtered using standard sputtering technique). The <111> Rocking Curve FWHM angle ranged from about 3.5 degrees to about 4 degrees; far in excess of the 1 degree or less desired on the basis of electromigration characteristics for the aluminum. Curve 488 shows data for a 500 Å thick Ti wetting layer and a 200 Å thick TiN barrier layer overlaid by an aluminum layer 5,000 Å thick. Although the <111> Rocking Curve FWHM angle was improved to range between about 2.25 degrees to about 3.1 degrees, it is still far in excess of the desired 1 degree or less.

Figure 4B:
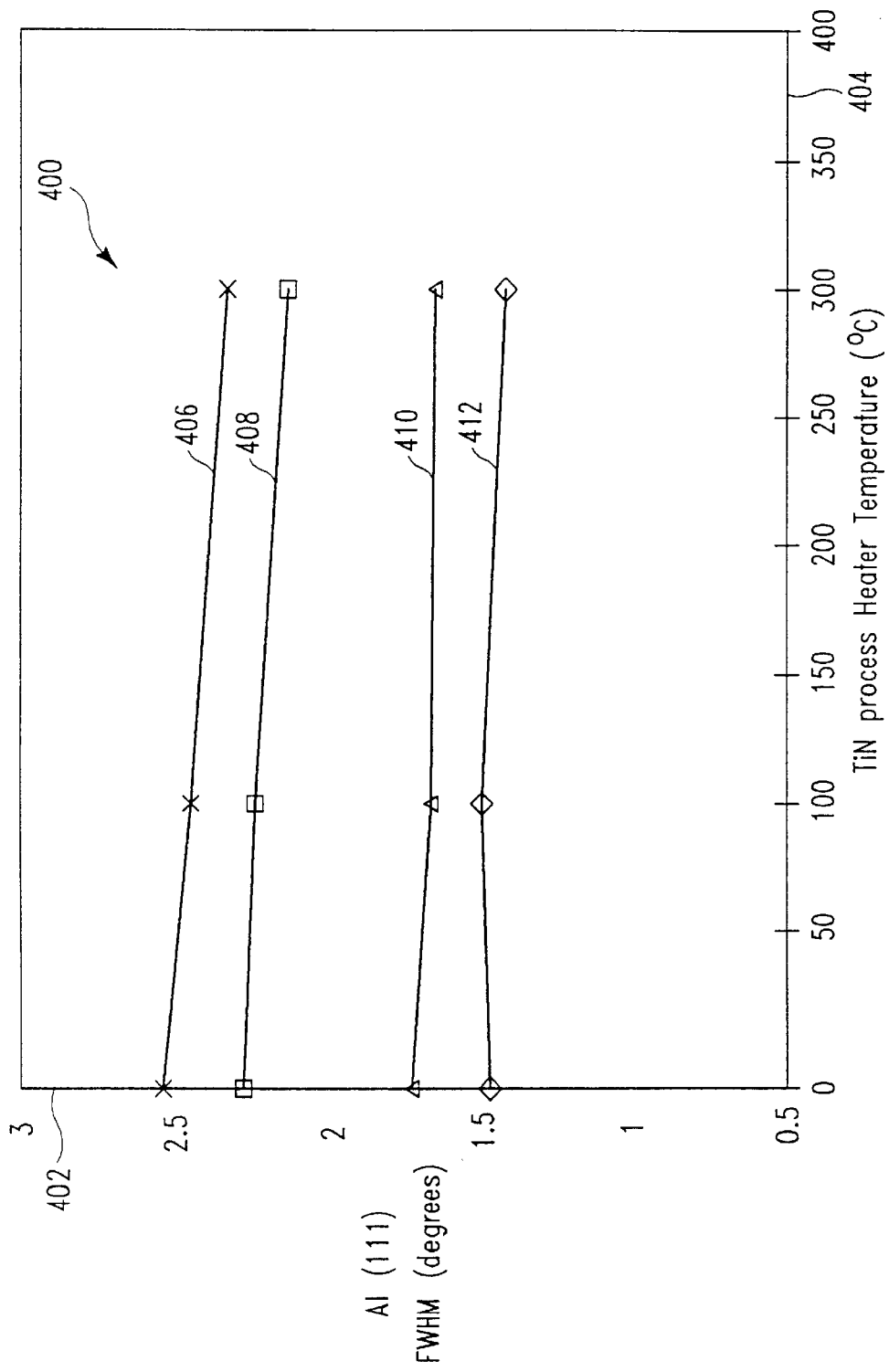
FIG. 4B is a graph showing comparative data for a three layer stack formed of a bi-layer wetting/barrier structure and an overlying aluminum layer. The wetting/barrier bi-layer structure consists of a layer of Ti and a layer of TiN, where the titanium layer was deposited using collimated sputtering technique and the titanium nitride was deposited using standard sputtering technique. The overlying layer of aluminum was deposited using standard sputtering technique. The <111> Rocking Curve FWHM angle of the aluminum layer is shown as a function of the TiN deposition temperature for two TiN layer thicknesses, and for two aluminum deposition temperatures.

FIG. 4B is a graph 400 showing additional prior art comparative data for the <111> Rocking Curve FWHM angle (shown on axis 402) of an aluminum layer deposited over a Ti/TiN wetting/barrier bi-layer barrier layer, as a function of the deposition temperature (shown on axis 404) of the TiN barrier layer. The Ti wetting layer was deposited using collimated techniques known in the art. The TiN barrier layer was deposited using standard reactive sputtering technique. An aluminum layer having a thickness of about 6,000 Å/m was deposited using standard sputtering technique. Curve 406 illustrates the <111> Rocking Curve FWHM angle of the overlying aluminum layer when the underlying Ti wetting layer was about 300 Å thick and the TiN barrier layer was about 1,200 Å thick and where the overlying aluminum layer was deposited at about 350° C. The resulting <111> Rocking Curve FWHM angle ranges from about 2.45 degrees to about 2.55 degrees, far higher than the desired 1 degree or less. Curve 408 shows the <111>

Rocking Curve FWHM angle of the overlying aluminum layer when the underlying Ti wetting layer was about 300 Å thick and the TiN barrier layer was about 800 Å thick. Although a reduction in the TiN thickness provided an improvement in the (111) FWHM, this indicator remains higher than 2 degrees. The aluminum was deposited at 350° C. again, but as will be shown later, this is more than an adequate aluminum deposition temperature when the underlying Ti/TiN wetting/barrier layer is deposited using the method of the present invention. Curve 410 represents an underlying Ti/TiN wetting/barrier layer where the thickness of the Ti layer was 300 Å and the thickness of the TiN layer was about 1,200 Å and the aluminum layer was deposited at 175° C. Surprisingly, deposition of the aluminum layer at this low temperature provided an improvement in (111) Rocking Curve FWHM angle over that obtained at an aluminum deposition temperature of 350° C. Still, the <111> Rocking Curve FWHM angle of the overlying aluminum layer remains at about 1.7 degrees. Curve 412 represents an underlying Ti/TiN wetting/barrier layer where the thickness of the Ti layer was about 300 Å and the thickness of the TiN layer was about 800 Å, and the aluminum layer deposited at 175° C. Once again, reducing the TiN barrier layer thickness provides an improvement in the <111> FWHM, but this indicator remains stubbornly at about 1.5 to 1.4 degrees; far above the desired 1 degree or less.

Figure 4C:
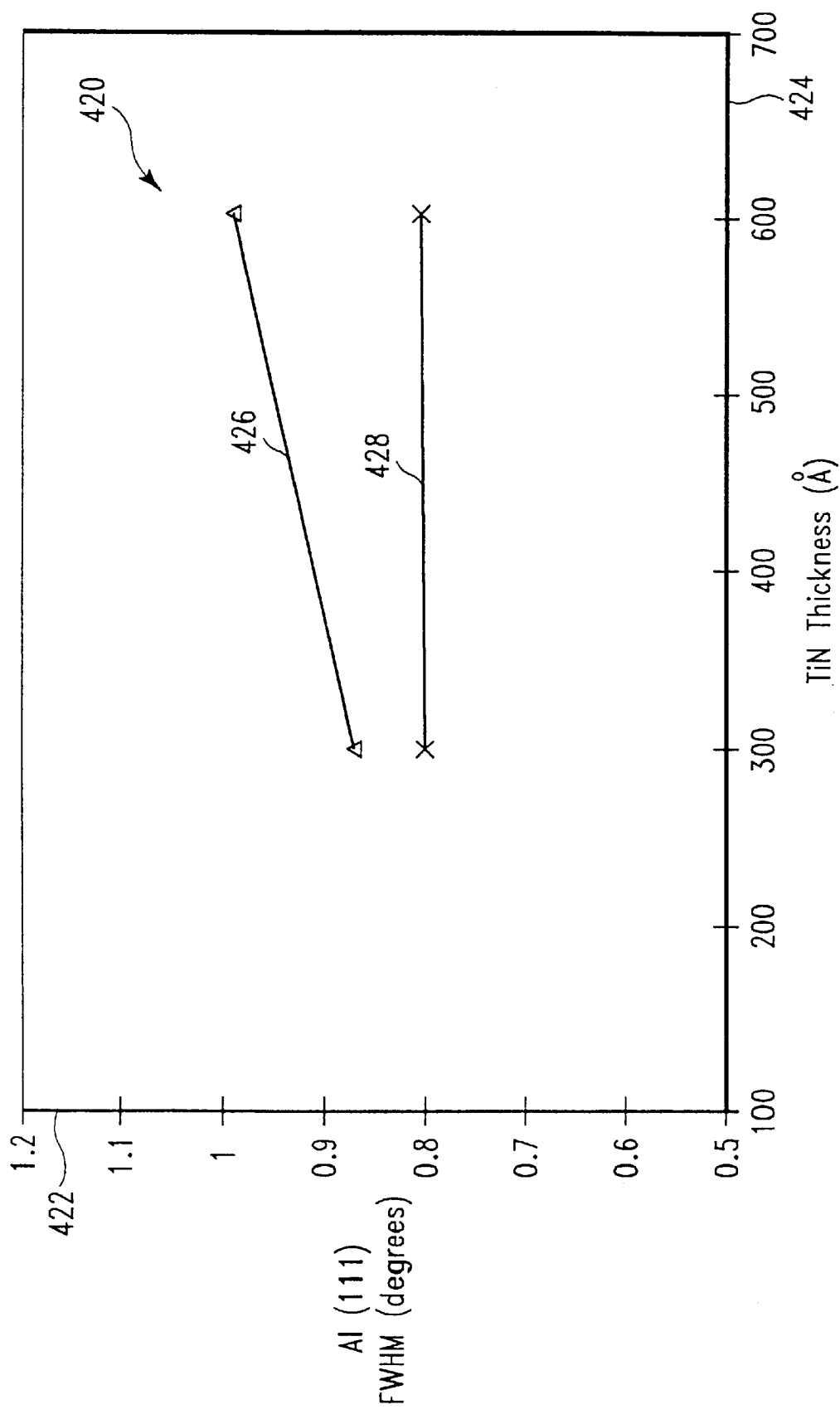
FIG. 4C is a graph showing comparative data for a three layer stack formed of a bi-layer wetting/barrier structure and an overlying aluminum layer prepared using the method of the present invention. The bi-layer structure consists of an initial layer of Ti deposited using a high density plasma, followed by a layer of TiN deposited using standard reactive sputtering techniques. The overlying aluminum layer was deposited using standard sputtering techniques. The <111> Rocking Curve FWHM angle of the aluminum layer is shown as a function of the thickness of the TiN layer when the Ti layer is deposited with and without an applied bias to the substrate.

FIG. 4C is a graph 420 showing the <111> Rocking Curve FWHM angle (shown on axis 422) for an aluminum layer deposited over a Ti/TiN wetting/barrier bi-layer as a function of the thickness (shown on axis 424) of the TiN layer. FIG. 4C illustrates one preferred embodiment of the present invention where the Ti wetting layer in the presence of a high density plasma and the TiN layer was deposited using standard sputtering technique. An aluminum layer about 4,500 Å thick was deposited over the Ti/TiN wetting/barrier layer at a temperature of about 300° C. Curve 426 represents an underlying Ti/TiN barrier layer where a 300 Å thick Ti layer was sputtered from a high density plasma at a temperature of about 150° C., followed by standard reactive sputtering of a TiN layer at about 250° C., having the thickness shown on axis 424 of graph 420. This wetting/barrier bi-layer was applied without application of a bias to the substrate. The resulting <111> Rocking Curve FWHM angle of the overlying aluminum layer was less than about 1 degree (ranging from about 0.86 to about 0.91 as the thickness of the TiN layer increased from about 300 Å to about 600 Å. Curve 428 shows the <111> Rocking Curve FWHM angle data for the aluminum layer deposited over a Ti/TiN wetting/barrier bi-layer where a 300 Å thick Ti layer was sputtered from a high density plasma at a temperature of about 150° C., followed by standard reactive sputtering of a TiN layer at about 250° C., having the thickness shown on axis 424. However, this Ti wetting layer was applied with a bias applied to the substrate to produce a voltage of about –33V. As a result, the <111> Rocking Curve FWHM angle of the overlying aluminum was reduced to about 0.80 degree over the entire TiN thickness range from about 300 Å to about 600 Å.

Figure 4D:
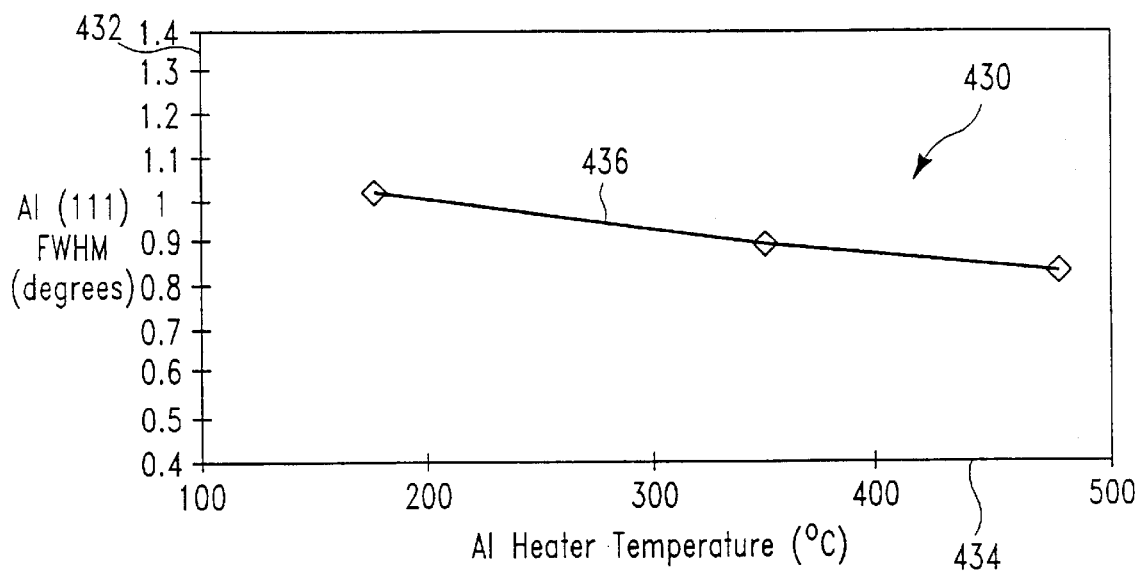
FIG. 4D is a graph showing how aluminum deposition temperature affects the <111> Rocking Curve FWHM angle of an aluminum layer deposited upon a bi-layer wetting/barrier structure of the kind shown in FIG. 4B (consisting of a Ti wetting layer deposited using a high density plasma and a TiN barrier layer deposited using standard reactive sputtering techniques).

FIG. 4D is a graph 430 showing the <111> Rocking Curve FWHM angle (shown on axis 432) for an aluminum layer approximately 5,000 Å thick deposited using standard sputtering conditions over a Ti/TiN bi-layer wetting/barrier layer, as a function of the aluminum layer deposition temperature (shown on axis 434 as the aluminum heater temperature, which is generally approximately 50° C. higher than the actual substrate temperature).

The Ti wetting layer was deposited in the presence of a high density plasma, with the substrate biased to about –26V. The Ti layer thickness was about 300 Å. The TiN layer was deposited using standard sputtering to a thickness of about 300 Å.

Curve 436 shows a decrease in Rocking Curve FWHM angle with increasing aluminum deposition temperature, and more importantly, the <111> Rocking Curve FWHM angle for the aluminum has been reduced so that it ranges from about 1.0 degree when the aluminum is deposited at a substrate temperature of about 125° C. (a heater temperature of about 175° C.) to about 0.8 degree when the aluminum is deposited at a substrate temperature of about 425° C. The <111> Rocking Curve FWHM angle of the aluminum layer has been reduced below the desired 1 degree by depositing the underlying Ti wetting layer using a high density plasma and with a low bias (–26 V on the substrate).

Figure 4E:
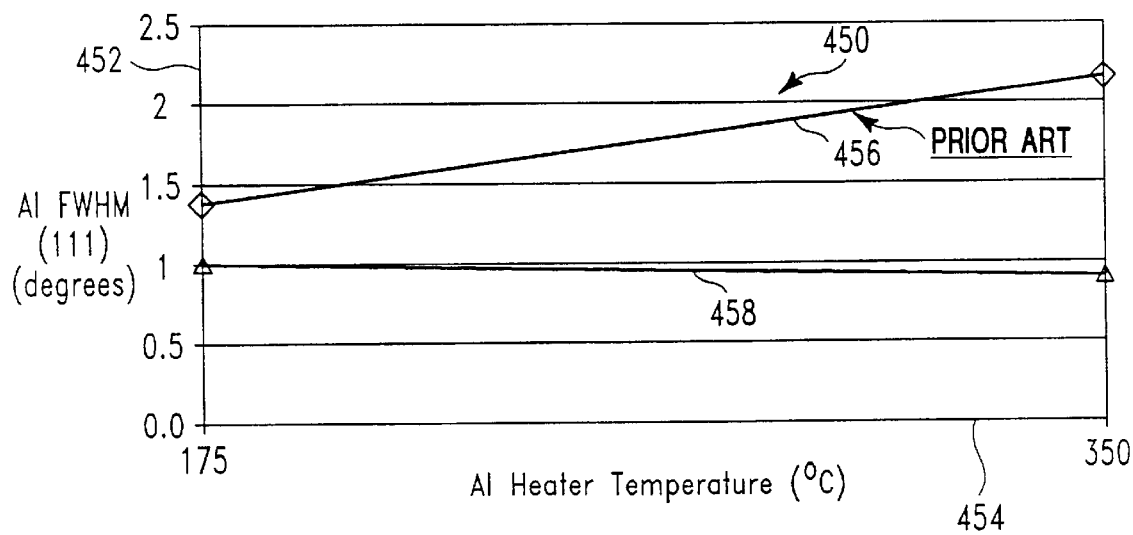
FIG. 4E is a graph showing a comparative example for the <111> Rocking Curve FWHM angle of an aluminum layer deposited over: 1) a bi-layer wetting/barrier structure of a Ti wetting layer deposited using a high density plasma (upon a moderately biased substrate at about −50 V) and a TiN barrier layer deposited using standard reactive sputtering techniques; and 2) a Ti wetting layer deposited using a collimated sputtering technique, followed by a TiN barrier layer deposited using standard reactive sputtering techniques.

FIG. 4E shows comparative data for the <111> Rocking Curve FWHM angle of a 5,000 Å thick aluminum layer deposited over two different Ti/TiN wetting/barrier bi-layer structures. barrier layers. Curve 456 represents a prior art wetting/barrier bi-layer structure where the Ti layer was deposited using a collimated sputtering technique, to a thickness of about 300 Å; and, the Ti/N layer was sputtered using standard, traditional sputtering to a thickness of about 300 Å. The <111> Rocking Curve FWHM angle (shown on axis 452) for Curve 456 ranges from about 1.4 degree to about 2.15 degree, with the Rocking Curve FWHM angle increasing as the substrate temperature is increased from about 125° to about 300° C. Curve 458 shows an improvement in the 111 Rocking Curve FWHM angle to about 1 degree or less, for an equivalent aluminum film deposited over a Ti/TiN bi-layer where the Ti layer was deposited using a high density plasma and a substrate biased to about –50 V, and the Ti/N layer was deposited using standard sputtering techniques. Again, the Ti layer was about 300 Å thick and the TiN layer was about 300 Å thick. This data shows the superiority of a Ti/TiN wetting/barrier layer when the Ti layer is sputtered in the presence of a high density plasma upon a moderately biased substrate.

Figure 4F:
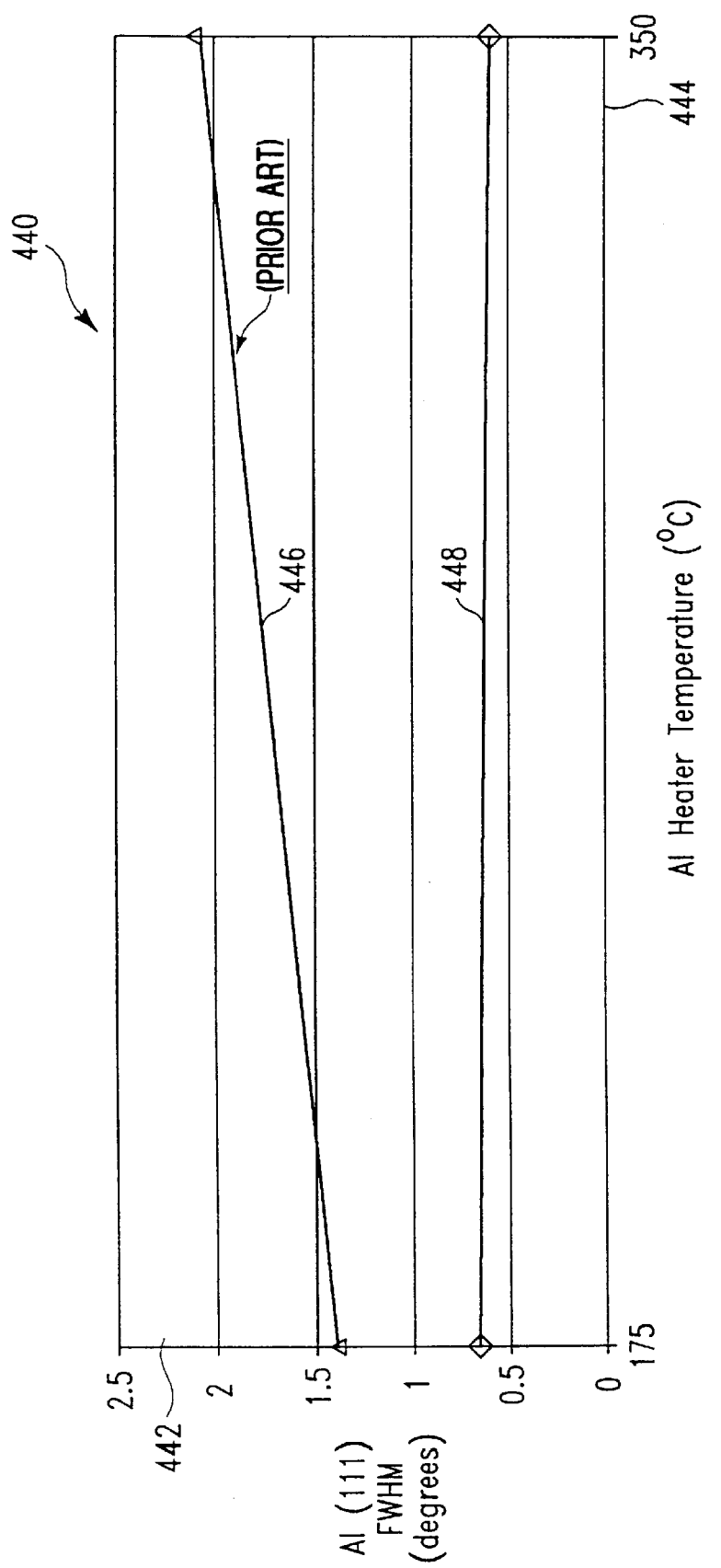
FIG. 4F is a graph showing comparative data for the <111> Rocking Curve FWHM angle of an aluminum layer deposited over a bi-layer Ti/TiN structure, where of the curves is for a bi-layer where the Ti layer was deposited using collimated sputtering technique, followed by a TiN layer applied using standard reactive sputtering, while the other curve is for a bi-layer applied using one of the more preferred embodiments of the present invention where both the Ti layer and the TiN layer are deposited using a high density plasma. In the second instance, both barrier layers were deposited using a collimation technique. The graph shows the Rocking Curve FWHM of the deposited aluminum layer as a function of the aluminum deposition temperature, in each instance. Although the thicknesses of the Ti and TiN barrier layers vary from one sample to the other, the variation is never over 20%, and this thickness variation is not considered to affect the comparative nature of this data.

FIG. 4F is a graph 440 showing comparative data for the <111> Rocking Curve FWHM angle (on axis 442) of a 5,000 Å thick aluminum layer sputter deposited using standard sputtering technique over a Ti/TiN bi-layer barrier layer, as a function of the aluminum layer deposition temperature (shown on axis 444 as the aluminum heater temperature). The Ti/TiN wetting/barrier layer illustrated by curve 446 in FIG. 4F was prepared by collimated sputtering of a 400 Å thick Ti layer, followed by standard reactive sputtering of an 800 Å thick TiN layer. The <111> Rocking Curve FWHM angle for the overlying aluminum layer ranged from about 1.4 to about 2.2, depending on the aluminum deposition temperature (heater temperature shown on axis 444). This compares with a much improved <111> Rocking Curve FWHM angle of about 0.7 degrees obtained for an aluminum layer deposited over Ti/TiN bi-layer comprising a 300 Å thick Ti layer deposited using a high density plasma and a 300 Å thick TiN layer deposited from a high density plasma. No substrate bias was applied during deposition of the Ti or TiN layers.

Figure 5A:
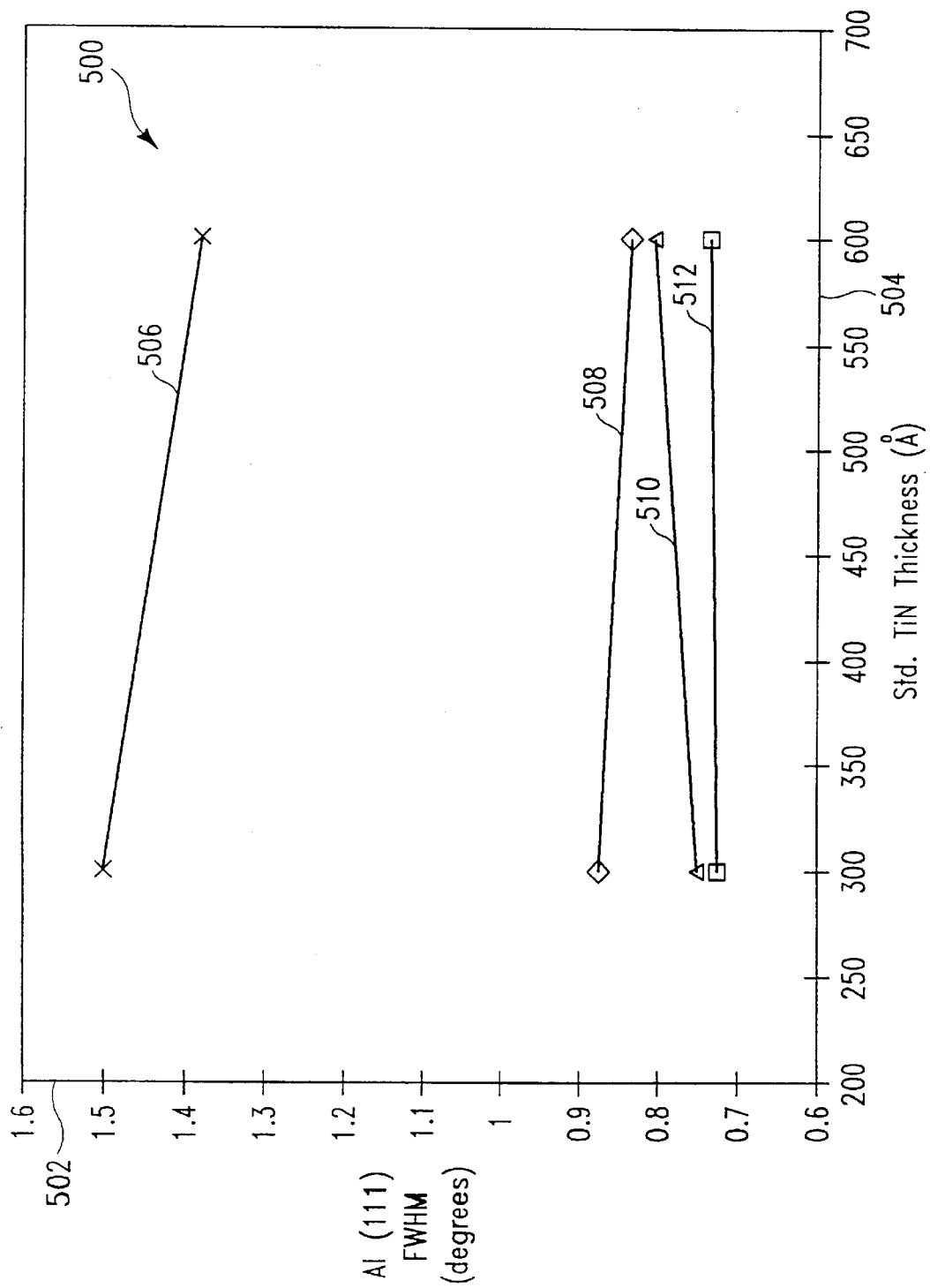
FIG. 5A is a graph showing the effect of substrate biasing during application of a Ti wetting layer of a Ti/TiN bi-layer structure upon the <111> Rocking Curve FWHM angle of an aluminum layer deposited over the Ti layer. The Ti layer was deposited using a high density plasma technique and the TiN and aluminum layers were deposited using standard sputtering technique. The aluminum <111> Rocking Curve FWHM is shown as a function of the TiN layer thickness as well.

FIG. 5A shows how substrate bias during deposition of the Ti layer of a Ti/TiN wetting/barrier layer affects the Rocking Curve FWHM angle of an aluminum layer subsequently deposited over the Ti/TiN layer. An aluminum layer approximately 4,500 Å thick was deposited over the wetting/barrier layer at a substrate temperature of about 300° C. using standard sputtering technique. A 300 Å thick layer of Ti was deposited from a high density plasma at a substrate temperature of about 150° C., followed by a TiN layer of the thickness shown on axis 504 of graph 500. The TiN layer was deposited using standard sputtering technique, without application of a substrate bias and at a substrate temperature of about 250° C. Curve 508 shows the <111> Rocking Curve FWHM angle (on axis 502) for the overlying aluminum layer when no substrate bias was applied during deposition of the Ti layer (there was a minimal self bias, the precise amount of which is unknown) Curve 510 shows the Rocking Curve FWHM angle of the overlying aluminum layer when the Ti layer was applied over a substrate biased to about −30 V. Curve 512 shows the Rocking Curve FWHM angle of the overlying aluminum layer when the Ti layer was applied over a substrate biased to about −50 V. Curve 506 shows the Rocking Curve FWHM angle of the overlying aluminum layer when the Ti layer was applied over a substrate biased to about −95 V. Obviously this substrate bias was too high, and as a result, the smooth, high density surface desired from the Ti/TiN wetting/barrier layer was not obtained. It is estimated that a substrate bias of greater than about −70 V would not provide any advantage over a substrate to which no bias is applied.

Figure 5B:
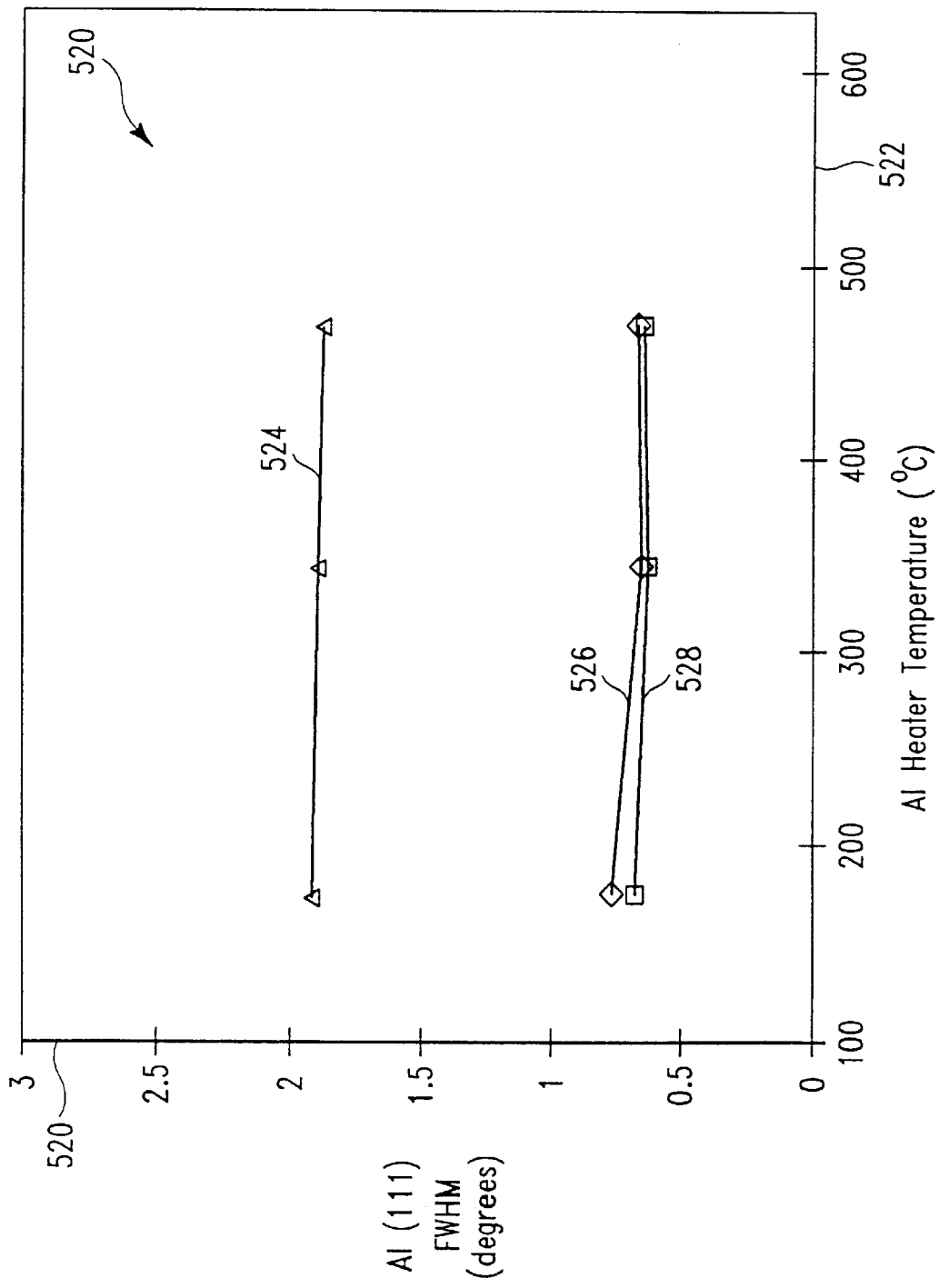
FIG. 5B is a graph showing the effect of substrate biasing during application of of the TiN barrier layer only. Each Ti layer was applied using a high density plasma technique with no substrate bias applied. Each TiN layer was applied using a high density plasma technique, with two of the TiN layers deposited without the application of substrate bias and one of the TiN layers deposited with −210 V on the substrate. The aluminum <111> Rocking Curve FWHM angle is shown as a function of the aluminum deposition temperature as well.

FIG. 5B illustrates the effect of the application of excessive bias to the substrate during deposition of the TiN layer of the bi-layer. A 5,000 Å thick layer of aluminum was deposited over the Ti/TiN wetting/barrier layer at a substrate temperature shown on axis 522 of graph 520. A 300 Å thick layer of Ti was deposited from a high density plasma upon a substrate to which no bias was applied, at a temperature of about 150° C. Subsequently, a 300 Å thick layer of TiN was deposited from a high density plasma upon a substrate at a temperature of about 250° C. Curve 528 shows the <111> Rocking Curve FWHM angle (on axis 520) for the overlying aluminum layer when the TiN layer was deposited over a substrate having no applied bias. Curve 526 shows the <111> Rocking Curve FWHM angle for the overlying aluminum layer when the power to the Ti target was lower (2 kW rather than 3 kW) during reactive sputtering of the TiN layer, with other conditions being about the same. Curve 524 shows the <111> Rocking Curve FWHM angle for the overlying aluminum layer when the substrate was biased to about −200V during deposition of the TiN layer and the power to the Ti target was 3 kW. As is readily apparent, an excessively biased substrate during deposition of the TiN layer can destroy the smooth high density surface required to obtain a <111> Rocking Curve FWHM angle of less than 1 degree regardless of proper deposition of the underlying Ti layer.

The above described preferred embodiments are not intended to limit the scope of the present invention, as one skilled in the art can, in view of the present disclosure expand such embodiments to correspond with the subject matter of the invention claimed below.

We claim:

1. A method of forming an aluminum layer comprising:
   a) depositing a layer of titanium upon a substrate using a high density plasma having an electron density of at least $5 \times 10^{10}$ e⁻/cm³; and
   b) depositing an aluminum layer over said layer of titanium, wherein said aluminum layer exhibits a <111> Rocking Curve FWHM angle of one degree or less over the surface of said titanium layer using either a high density plasma or a standard sputtering technique.

2. The method of claim 1, wherein said layer of titanium is deposited to a thickness ranging from about 100 Å to about 300 Å.

3. The method of claim 1 or claim 2, wherein said substrate upon which said layer of titanium is deposited is biased from about 0 V to about −95 V.

4. The method of claim 1 or claim 2, wherein said aluminum is deposited at a temperature ranging from about 75° C. to about 500° C.

5. The method of claim 1 or claim 2, wherein said aluminum is deposited at a temperature of less than about 350° C.

6. The method of claim 3, wherein said aluminum is deposited at a temperature ranging from about 75° C. to about 500° C.

7. The method of claim 3, wherein said aluminum is deposited at a temperature of less than about 350° C.

8. A method of forming an aluminum layer comprising:
   a) depositing a layer of titanium upon a substrate using a high density plasma having an electron density of at least $5 \times 10^{10}$ e⁻/cm³;
   b) depositing a layer of titanium nitride over the surface of said titanium layer; and
   c) depositing an aluminum layer having a <111> Rocking Curve FWHM angle of one degree or less over the surface of said titanium nitride layer using either a high density plasma or a standard sputtering technique.

9. The method of claim 8, wherein said layer of titanium is deposited to a thickness ranging from about 100 Å to about 300 Å.

10. The method of claim 8, wherein said layer of titanium nitride is deposited using a high density plasma reactive sputtering technique.

11. The method of claim 8, wherein said layer of titanium nitride is deposited using a standard reactive sputtering technique.

12. The method of claim 8, wherein said substrate upon which said layer of titanium is deposited is biased from about 0 V to about −95 V.

13. The method of claim 8 or claim 9, or claim 10, or claim 11, or claim 12, wherein said aluminum is deposited at a temperature ranging from about 75° C. to about 500° C.

14. The method of claim 8, or claim 9, or claim 10, or claim 11, or claim 12 wherein said aluminum is deposited at a temperature of less than about 350° C.

15. A method of forming an aluminum layer comprising:
   a) depositing a first layer of titanium upon a substrate using a high density plasma having an electron density of at least $5 \times 10^{10}$ e⁻/cm³;
   b) depositing a layer of titanium nitride over the surface of said first layer of titanium;
   c) depositing a second layer of titanium over the surface of said titanium nitride layer; and
   d) depositing an aluminum layer having a <111> Rocking Curve FWHM angle of one degree or less over the surface of said second layer of titanium using either a high density plasma or a standard sputtering technique.

16. The method of claim 15, wherein said first layer of titanium is deposited to a thickness ranging from about 100 Å to about 300 Å.

17. The method of claim 15, wherein said layer of titanium nitride is deposited using a high density plasma reactive sputtering technique.

18. The method of claim 15, wherein said layer of titanium nitride is deposited using a standard reactive sputtering technique.

19. The method of claim 15, wherein said substrate upon which said first layer of titanium is deposited is biased from about 0 V to about −95 V.

20. The method of claim 15, wherein said second layer of titanium is deposited using a high density plasma.

21. The method of claim 17, wherein said second layer of titanium is deposited using a high density plasma.

22. The method of claim 16, or claim 18, or claim 19, wherein said aluminum is deposited at a temperature of less than about 500° C.

23. The method of claim 15, or claim 16, or claim 17, or claim 18, or claim 19, or claim 20, or claim 21, wherein said aluminum is deposited at a temperature of less than about 350° C.

24. A method of forming an aluminum layer comprising:
a) sputter depositing a layer of titanium upon a substrate using a high density plasma, wherein at least a portion of said titanium is ionized during target sputtering and reionized prior to depositing on said substrate; and
b) sputter depositing an aluminum layer over said layer of titanium, wherein said aluminum layer exhibits a <111> Rocking Curve FWHM angle of one degree or less over the surface of said titanium layer using either a high density plasma or a standard sputtering technique.

25. The method of claim 24, including an additional step:
c) pattern etching said aluminum layer, where by reduced pitting of etched sidewalls is achieved due to the <111> Rocking Curve FWHM of said aluminum layer.

26. The method of claim 24, wherein said layer of titanium is deposited to a thickness ranging from about 100 Å to about 300 Å.

27. The method of claim 24 or claim 25, wherein said substrate upon which said layer of titanium is deposited is biased from about 0 V to about −95 V.

28. The method of claim 24 or claim 25, or claim 26, wherein said aluminum is deposited at a temperature ranging from about 75° C. to about 500° C.

29. The method of claim 24 or claim 25, or claim 26, wherein said aluminum is deposited at a temperature of less than about 350° C.

30. The method of claim 29, wherein said aluminum is deposited at a temperature ranging from about 75° C. to about 500° C.

31. The method of claim 29, wherein said aluminum is deposited at a temperature of less than about 350° C.

32. The method of claim 24, including an additional step:
d) pattern etching said aluminum layer, whereby reduced pitting of etched sidewalls is achieved due to the <111> Rocking Curve FWHM of said aluminum layer.

33. A method of forming an aluminum layer comprising:
a) sputter depositing a layer of titanium upon a substrate using a high density plasma, wherein at least a portion of said titanium is ionized during target sputtering and reionized prior to depositing on said substrate;
b) sputter depositing a layer of titanium nitride over the surface of said titanium layer; and
c) sputter depositing an aluminum layer having a <111> Rocking Curve FWHM angle of one degree or less over the surface of said titanium nitride layer using either a high density plasma or a standard sputtering technique.

34. The method of claim 33, wherein said layer of titanium is deposited to a thickness ranging from about 100 Å to about 300 Å.

35. The method of claim 33, wherein said layer of titanium nitride is deposited using a high density plasma reactive sputtering technique.

36. The method of claim 33, wherein said layer of titanium nitride is deposited using a standard reactive sputtering technique.

37. The method of claim 33, wherein said substrate upon which said layer of titanium is deposited is biased from about 0 V to about −95 V.

38. The method of claim 33, or claim 32, or claim 34, or claim 35, or claim 36, or claim 37, wherein said aluminum is deposited at a temperature ranging from about 75° C. to about 500° C.

39. The method of claim 33, or claim 32, or claim 34, or claim 35, or claim 36, or claim 37, wherein said aluminum is deposited at a temperature of less than about 350° C.

40. A method of forming an aluminum layer comprising:
a) sputter depositing a first layer of titanium upon a substrate using a high density plasma, wherein at least a portion of said titanium is ionized during target sputtering and reionized prior to depositing on said substrate;
b) sputter depositing a layer of titanium nitride over the surface of said first layer of titanium;
c) sputter depositing a second layer of titanium over the surface of said titanium nitride layer; and
d) sputter depositing an aluminum layer having a <111> Rocking Curve FWHM angle of one degree or less over the surface of said second layer of titanium using either a high density plasma or a standard sputtering technique.

41. The method of claim 40, including an additional step:
e) pattern etching said aluminum layer, whereby reduced pitting of etched sidewalls is achieved due to the <111> Rocking Curve FWHM of said aluminum layer.

42. The method of claim 40, wherein said first layer of titanium is deposited to a thickness ranging from about 100 Å to about 300 Å.

43. The method of claim 40, wherein said layer of titanium nitride is deposited using a high density plasma reactive sputtering technique.

44. The method of claim 40, wherein said layer of titanium nitride is deposited using a standard reactive sputtering technique.

45. The method of claim 40, wherein said substrate upon which said first layer of titanium is deposited is biased from about 0 V to about −95 V.

46. The method of claim 40, wherein said second layer of titanium is deposited using a high density plasma.

47. The method of claim 40, or claim 41, or claim 42, wherein said aluminum is deposited temperature of less than about 500° C.

48. The method of claim 40, or claim 41, or claim 42, or claim 43, or claim 44, or claim 45, or claim 46, or claim 47, wherein said aluminum is deposited at a temperature of less than about 350° C.

* * * * *